(12) United States Patent
Zhu et al.

(10) Patent No.: US 10,103,215 B1
(45) Date of Patent: Oct. 16, 2018

(54) DISPLAY PANEL AND DISPLAY DEVICE CONTAINING DISPLAY PANEL

(71) Applicant: Shanghai Tianma AM-OLED Co., Ltd., Shanghai (CN)

(72) Inventors: Minyu Zhu, Shanghai (CN); Bozhang Sun, Shanghai (CN); Minfu Zhang, Shanghai (CN)

(73) Assignee: SHANGHAI TIANMA AM-OLED CO., LTD. (CN)

( * ) Notice: Subject to any disclaimer, the term of this patent is extended or adjusted under 35 U.S.C. 154(b) by 0 days.

(21) Appl. No.: 15/702,121

(22) Filed: Sep. 12, 2017

(30) Foreign Application Priority Data

Apr. 13, 2017 (CN) .......................... 2017 1 0239659

(51) Int. Cl.
*H01L 27/32* (2006.01)
*H01L 25/18* (2006.01)

(52) U.S. Cl.
CPC ........ *H01L 27/3276* (2013.01); *H01L 27/329* (2013.01); *H01L 27/3279* (2013.01)

(58) Field of Classification Search
None
See application file for complete search history.

(56) References Cited

U.S. PATENT DOCUMENTS 8,552,655 B2 * 10/2013 Ono ...................... G09G 3/3233
  315/187
2005/0184672 A1 * 8/2005 Lee ...................... H01L 27/3279
  315/169.3
2009/0262046 A1 * 10/2009 Nathan ................. G09G 3/3225
  345/76
2012/0062130 A1 * 3/2012 Ono ...................... G09G 3/3233
  315/187

FOREIGN PATENT DOCUMENTS

CN         1638542 A         7/2005

OTHER PUBLICATIONS

Chinese Office Action for corresponding Chinese Application Serial No. 201710239659.6, dated Aug. 22, 2018, pp. 1-10.

* cited by examiner

*Primary Examiner* — Joseph Schoenholtz
(74) *Attorney, Agent, or Firm* — Tarolli, Sundheim, Covell & Tummino LLP (57) ABSTRACT

The present disclosure provides a display panel and a display device including the display panel. The display panel includes a display area and a peripheral area outside the display area. The display area is provided with OLEDs, first and second power lines. The peripheral area is provided with at least one driving chip. OLEDs are distributed in a matrix. First power lines extend in a first direction, second power lines extend in a second direction, and first power lines are intersected and connected with second power lines to form a grid structure electrically connected with anodes of OLEDs. The driving chip is electrically connected with the grid structure. The grid structure includes grids defined by first power lines being intersected with second power lines, and has a larger grid density at one position than that at another position closer to the driving chip.

11 Claims, 7 Drawing Sheets

DISPLAY PANEL AND DISPLAY DEVICE CONTAINING DISPLAY PANEL

CROSS-REFERENCE TO RELATED APPLICATIONS

The present application claims priority to Chinese Patent Application No. 201710239659.6, filed on Apr. 13, 2017, the content of which is incorporated herein by reference in its entirety.

TECHNICAL FIELD

The present disclosure relates to the field of display technologies and, particularly, relates to a display panel and a display device.

BACKGROUND

In a display product having an organic light-emitting diode (Organic Light-Emitting Diode, OLED), a display panel includes a plurality of display units distributed in a matrix in a display area. Each display unit is provided with an OLED, and an anode of the OLED is electrically connected with a power line, the power line extends from the display area to a non-display area and is electrically connected with a driving chip, the driving chip supplies electric energy to the OLEDs of the plurality of display units through the power line.

However, in a transmission process of the power from the driving chip to the OLED, due to the resistance of the power line itself and the charge consumption during light-emitting of the OLED, different positions on the power line has different voltage values, a position closer to the driving chip has a higher voltage, and a position further away from the driving chip has a lower voltage. As a result, power supply voltages received by the OLEDs at different positions have different values, leading to a non-uniform brightness of the display screen of the display product, that is, an OLED closer to the driving chip has a higher brightness, and an OLED further away from the driving chip has a lower brightness.

SUMMARY

In view of the above, embodiments of the present disclosure provide a display panel and a display device, which can improve the problem of a non-uniform brightness of the display screen.

In a first aspect, the present disclosure provides a display panel, the display panel includes a display area and a peripheral area outside the display area; wherein the display area includes a plurality of organic light-emitting diodes (OLEDs), a plurality of first power lines and a plurality of second power lines; and the peripheral area includes at least one driving chip; wherein the plurality of OLEDs is distributed in a matrix; the plurality of first power lines extends in a first direction, the plurality of second power lines extends in a second direction, the plurality of first power lines is intersected and connected with the plurality of second power lines to form an integrated grid structure, and the grid structure is electrically connected with anodes of the plurality of OLEDs; the at least one driving chip is electrically connected with the grid structure; wherein the grid structure includes a plurality of grids defined by the plurality of first power lines being intersected with the plurality of second power lines; the larger a distance of a position of the grid structure away from the at least one driving chip is, the larger a grid density of the position of the grid structure is.

In another aspect, the present disclosure provides a display device, and the display device includes the above display panel.

In the display panel and the display device provided by embodiments of the present disclosure, the grid structure is defined by the plurality of first power lines intersecting with the plurality of second power lines, the grid density of the position closer to the driving chip is smaller, and the resistance is larger accordingly; the grid density of the position further away from the driving chip is larger, and the resistance is smaller accordingly. Thus in the power supplying process, in the grid structure, current transmitted in the grids is uniform at different positions, so that power supply voltages received by the OLEDs are uniform at different positions, thereby solving the problem of a non-uniform brightness of the display screen.

BRIEF DESCRIPTION OF DRAWINGS

In order to more clearly illustrate technical solutions in embodiments of the present disclosure, the accompanying drawings used in the embodiments are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

In order to better understand technical solutions of the present disclosure, embodiments of the present disclosure will be illustrated in detail with reference to the accompanying drawings.

It should be understood that, the described embodiments are merely exemplary embodiments of the present disclosure, which shall not be interpreted as limiting the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
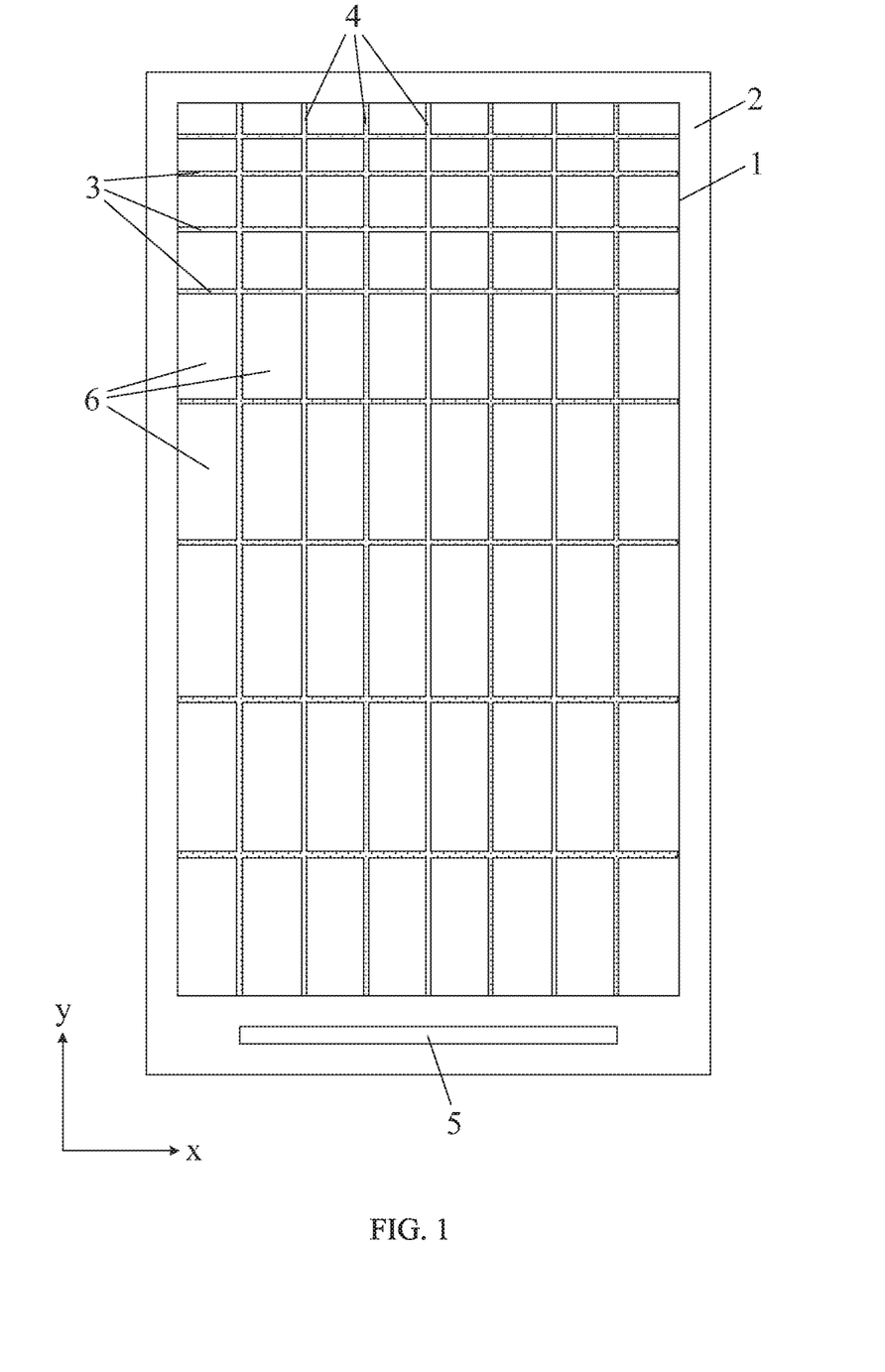
FIG. 1 illustrates a structural schematic diagram of a display panel according to an embodiment of the present disclosure.

As shown in FIG. 1, which illustrates a structural schematic diagram of a display panel in accordance with an exemplary embodiment of the present disclosure, the present disclosure provides a display panel, including: a display area 1 and a peripheral area 2 outside the display area 1. The display area 1 is provided with a plurality of OLEDs distributed in a matrix (not shown in FIG. 1). The OLED usually includes an anode, a cathode, and a light-emitting layer located between the anode and the cathode. The display area 1 is provided with a plurality of first power lines 3 extending along a first direction x and a plurality of second power lines 4 extending along a second direction y, the plurality of first power lines 3 and the plurality of second power lines 4 intersect with each other to form an integrated grid structure. The grid structure is electrically connected with anodes of the plurality of OLEDs. The peripheral area 2 is provided with at least one driving chip 5, the at least one driving chip 5 is electrically connected with the grid structure. The grid structure includes a plurality of grids 6 defined by the plurality of first power lines 3 intersecting with the plurality of second power lines 4. In a direction away from the at least one driving chip 5, the grid density of the grid structure is larger when the position of the grid structure is further away from the at least one driving chip 5.

The display panel shown in FIG. 1 only includes one driving chip 5, the driving chip 5 is located below the display area 1. Based on the location of the driving chip 5, the driving chip 5 is electrically connected with the grid structure at a position below the display area 1, and the driving chip 5, as a power supply, supplies power to the plurality of OLEDs distributed in a matrix in the display area 1 through the grid structure. In the grid structure, the grid density of the position closer to the driving chip 5 is smaller, and a resistance is larger accordingly; the grid density of the position further away from the driving chip 5 is larger, and a resistance is smaller accordingly. Therefore, in the power supplying process, in the grid structure, current transmitted in the grids is uniform at different positions.

It should be rioted that, FIG. 1 only shows a display panel structure including one driving chip 5, embodiments of the present disclosure do not limit the number and location of the driving chip 5. In the following embodiments, the display panel structure will be further illuminated by examples of including two driving chips or four driving chips.

In the embodiment of the present disclosure, the display panel is provided with the grid structure defined by the plurality of first power lines intersecting with the second power lines, the grid density of the position closer to the driving chip 5 is smaller, and the resistance is larger accordingly; the grid density of the position further away from the driving chip 5 is larger, and the resistance is smaller accordingly. Thus, in the power supplying process, in the grid structure, current transmitted in the grids is uniform at different positions, so that power supply voltages received by the OLEDs at different positions are uniform, thereby solving the problem of a non-uniform brightness of the display screen.

Figure 2:
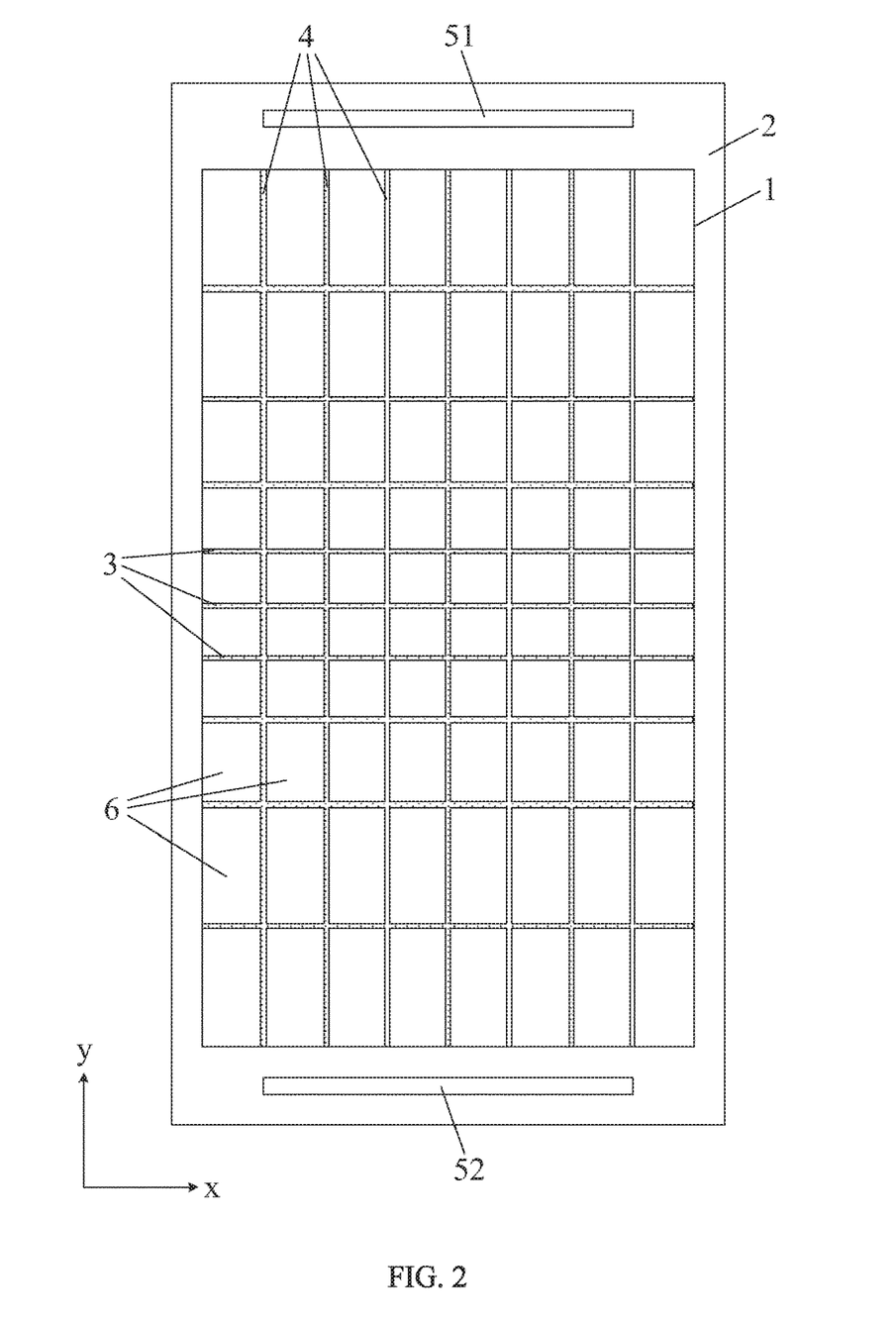
FIG. 2 illustrates a structural schematic diagram of another display panel according to an embodiment of the present disclosure.

Optionally, as shown in FIG. 2, which illustrates a structural schematic diagram of another display panel in accordance with an exemplary embodiment of the present disclosure, the above-described at least one driving chip includes a first driving chip 51 and a second driving chip 52. The first driving chip 51 and the second driving chip 52 are respectively located at two opposite sides of the display area 1. The first driving chip 51 and the second driving chip 52 are respectively electrically connected with the grid structure respectively at a lower position and an upper position of the display area 1, that is, the first driving chip 51 and the second driving chip 52, as power supplies, supply power to the plurality of OLEDs distributed in a matrix in the display area 1 via the grid structure simultaneously from both the upper and lower positions of the display area 1, thus grid densities at the upper position and the lower position of the grid structure are relatively smaller, and the grid density at a middle position thereof is relatively smaller. Thus, in the power supplying process, in the grid structure, current transmitted in the grids is uniform at different positions. FIG. 2 merely shows a structure that the first driving chip 51 and the second driving chip 52 are respectively located at upper and lower sides of the display area 1, it should be understood that, the first driving chip 51 and the second driving chip 52 can also be located at left and right sides of the display area 1. Embodiments of the present disclosure do not limit the location of the driving chip with respect to the display area 1.

Figure 3:
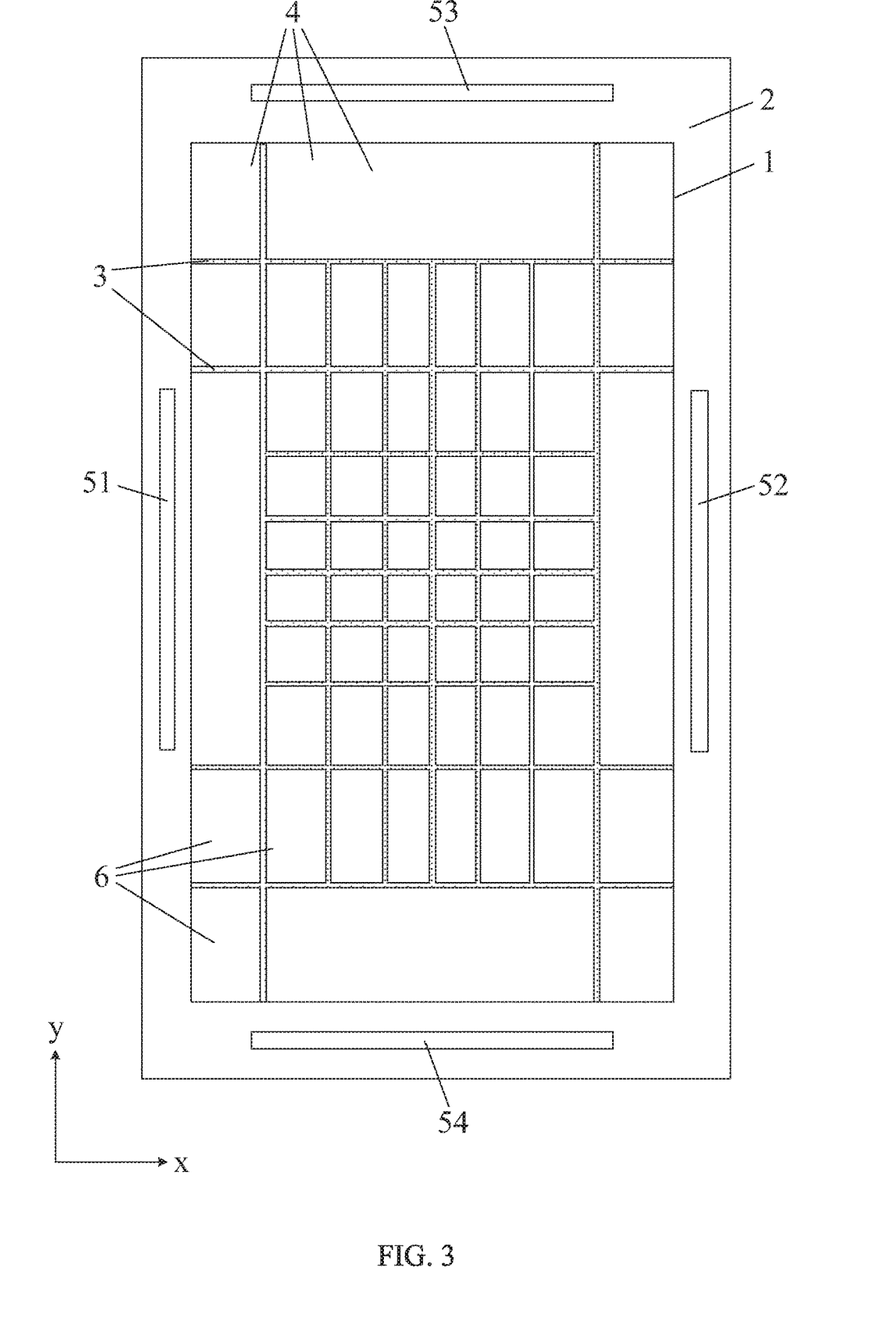
FIG. 3 illustrates a structural schematic diagram of still another display panel according to an embodiment of the present disclosure.

Optionally, as shown in FIG. 3, which illustrates a structural schematic diagram of still another display panel in accordance with an exemplary embodiment of the present disclosure, the above-described at least one driving chip includes a first driving chip 51, a second driving chip 52, a third driving chip 53 and a fourth driving chip 54. In the first direction x, the first driving chip 51 and the second driving chip 52 are respectively located at two opposite sides of the display area 1; in the second direction y, the third driving chip 53 and the fourth driving chip 54 are respectively located at two opposite sides of the display area 1. The driving chips are respectively arranged at a periphery of the display area 1 and are electrically connected with the grid structure, that is, the driving chips, as power supplies, supply power to the plurality off OLEDs distributed in a matrix in the display area 1 via the grid structure simultaneously from the periphery of the display area 1. Thus the grid density of the periphery of the grid structure is relatively smaller, and the grid density of the middle position is relatively larger, so that in the power supplying process, in the grid structure, current transmitted in the grids is uniform at different positions.

Figure 4:
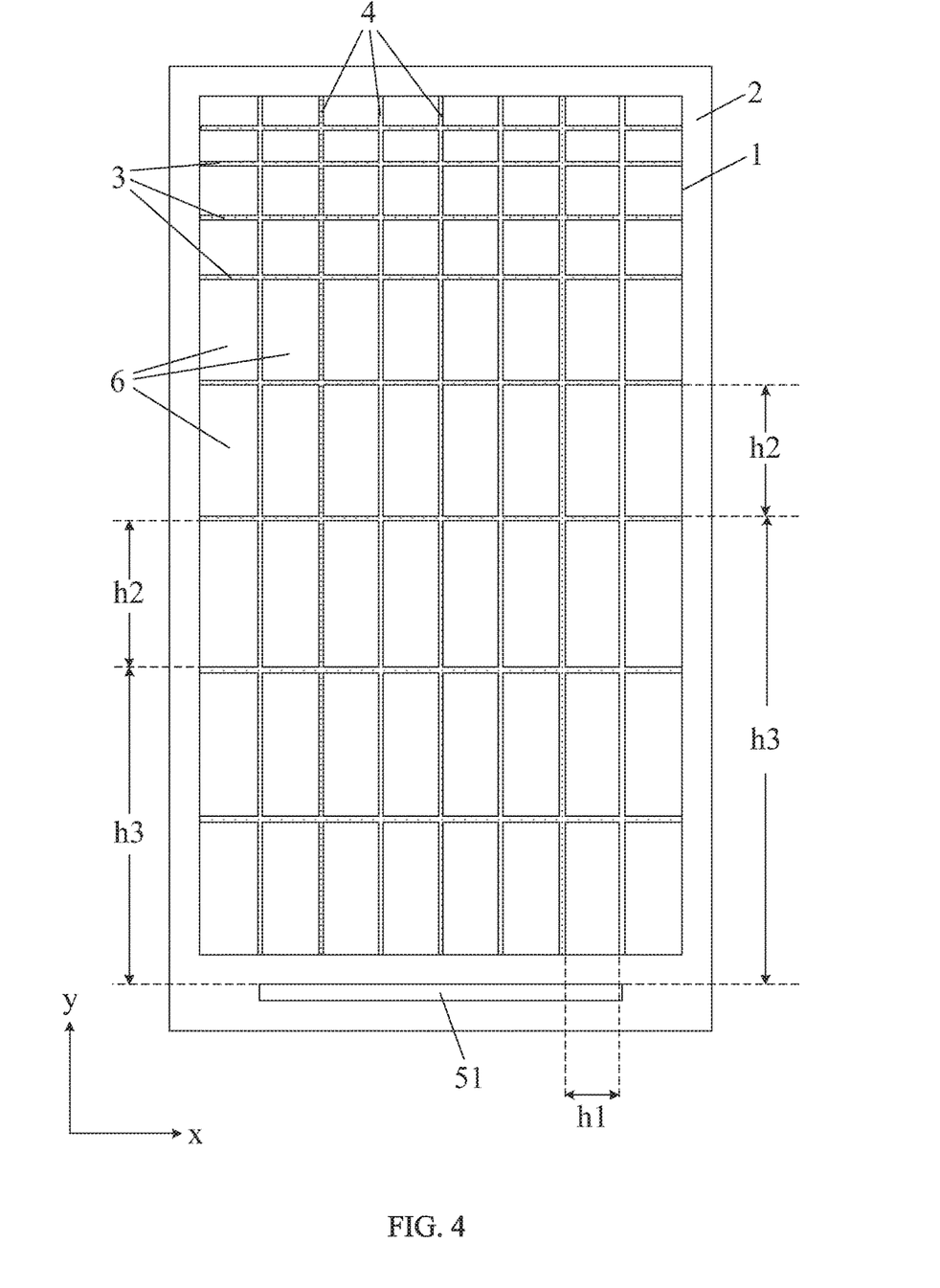
FIG. 4 illustrates a structural schematic diagram of still another display panel according to an embodiment of the present disclosure.

Optionally, as shown in FIG. 4, which illustrates a structural schematic diagram of still another display panel in accordance with an exemplary embodiment of the present disclosure, the above-described at least one driving chip includes a first driving chip 51, in the second direction y, the first driving chip 51 is located at a side of the display area 1.

Optionally, as shown in FIG. 4, the first direction x is perpendicular to the second direction y.

Optionally, as shown in FIG. 4, the plurality of grids 6 is distributed in a matrix, a length h1 of each grid 6 in the first direction x is equal to each other. The plurality of grids 6 is arranged in multiple rows along the second direction y. A length h2 of each row of the grids 6 in the second direction y is in negative correlation with a distance h3 between the row of the grids 6 and the first driving chip 51. That is, the larger the distance h3 between the grid 6 and the first driving chip 51 is, the smaller the length h2 of the grid 6 in the second direction y is. Thus, the length h2 of the grid 6 in the second direction y can be set according to the distance h3 between the grid 6 and the first driving chip 51, thus grid densities at different positions of the grid structure are different, so that in the power supplying process, in the grid structure, current transmitted in the grids is uniform at different positions.

Figure 5:
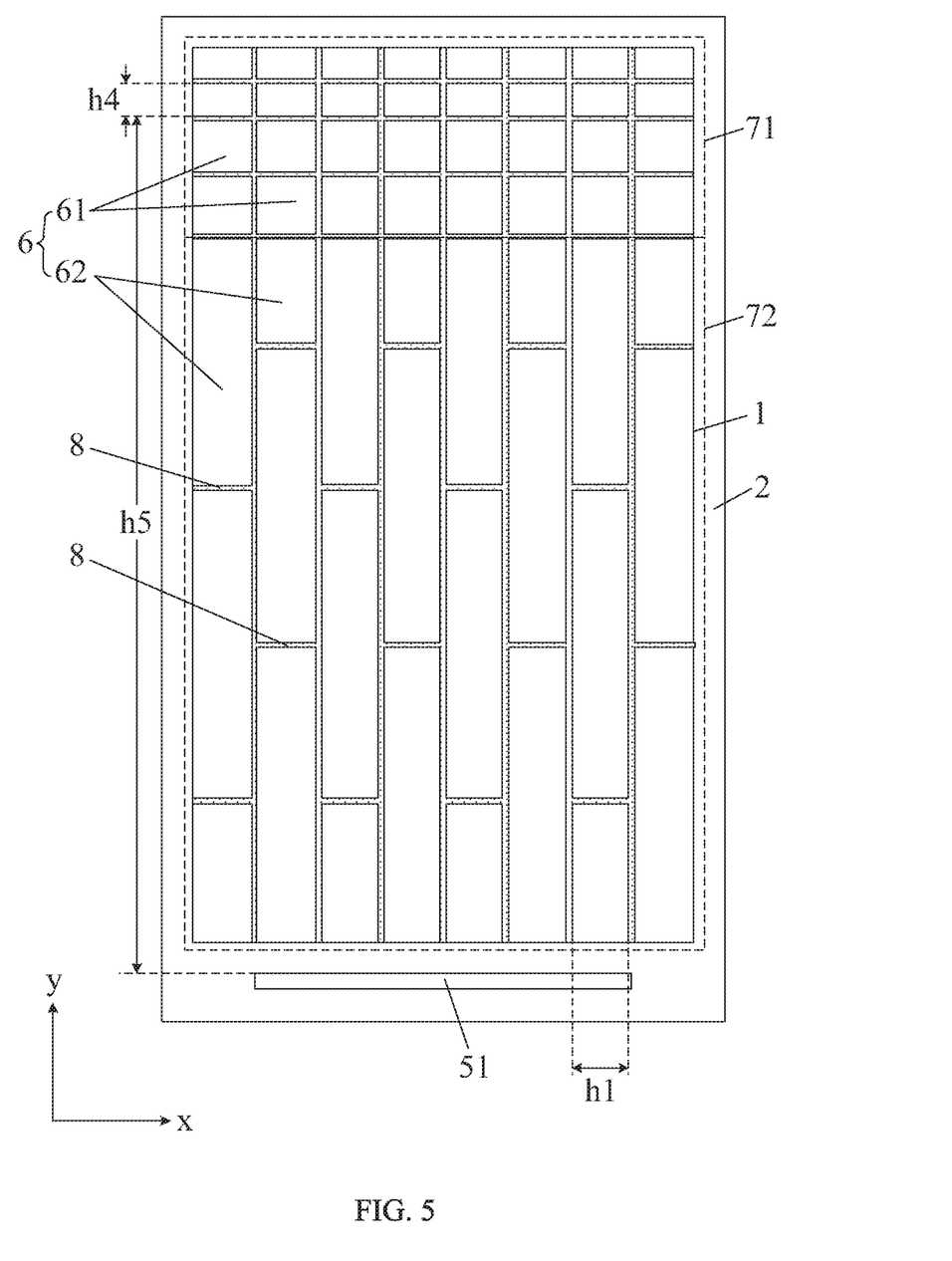
FIG. 5 illustrates a structural schematic diagram of still another display panel according to an embodiment of the present disclosure.

Optionally, as shown in FIG. 5, which illustrates a structural schematic diagram of still another display panel in accordance with an exemplary embodiment of the present disclosure, a length h1 of each grid 6 in the first direction x is equal to each other. The grid structure includes a first area 71 and a second area 72, the first area 71 is a portion of the display area 1 away from the first driving chip 51, and the second area 72 is a portion of the display area 1 close to the first driving chip 51. The grid density in the first area 71 is larger than the grid density in the second area 72. The plurality of grids 6 includes a plurality of first grids 61 in the first area 71 and a plurality of second grids 62 in the second area 72. The plurality of first grids 61 is distributed in a matrix; the plurality of second grids 62 is arranged in multiple columns along the first direction x, each column of second grids 62 includes multiple second grids 62 distributed along the second direction y. In each column of second grids 62, any adjacent two second grids 62 have a common edge 8; in any adjacent two columns of second grids 62, any two common edges 8 in different columns are respectively positioned at two straight lines parallel to each other. That is, the common edges 8 in any adjacent two columns of second grids 62 have an interval therebetween in a direction perpendicular to the two parallel straight lines where the common edges 8 are located. By providing the grids with different density distribution in the first area 71 and the second area 72, the further the position of the grid structure 6 is away from the first driving chip 51, the grid density of the grid structure 6 is larger when the position of the grid structure is further away from the first driving chip 51, so that in the power supplying process, in the grid structure, current transmitted in the grids is uniform at different positions.

Optionally, as shown in FIG. 5, a length of any second grid 62 in the second direction y is larger than a length of any first grid 61 in the second direction y. That is, by setting different lengths of the first grid 61 and the second grid 62 in the second direction y, the grid density in the first area 71 is different from the grid density in the second area 72.

Optionally, as shown in FIG. 5, the plurality of first grids 61 is arranged in a plurality of rows along the second direction y. A length h4 of each row of the first grids 61 in the second direction y is in negative correlation with a distance h5 between the first grid 61 and the first driving chip 51, that is, the larger the distance h5 between the first grid 61 and the first driving chip 51 is, the smaller the length h4 of the first grid 61 in the second direction y is. As a result, in the first area 71, the closer a position to the driving chip is, the larger the resistance at the position is, and the further a position is away from the driving chip, the smaller the resistance at the position is.

Figure 6:
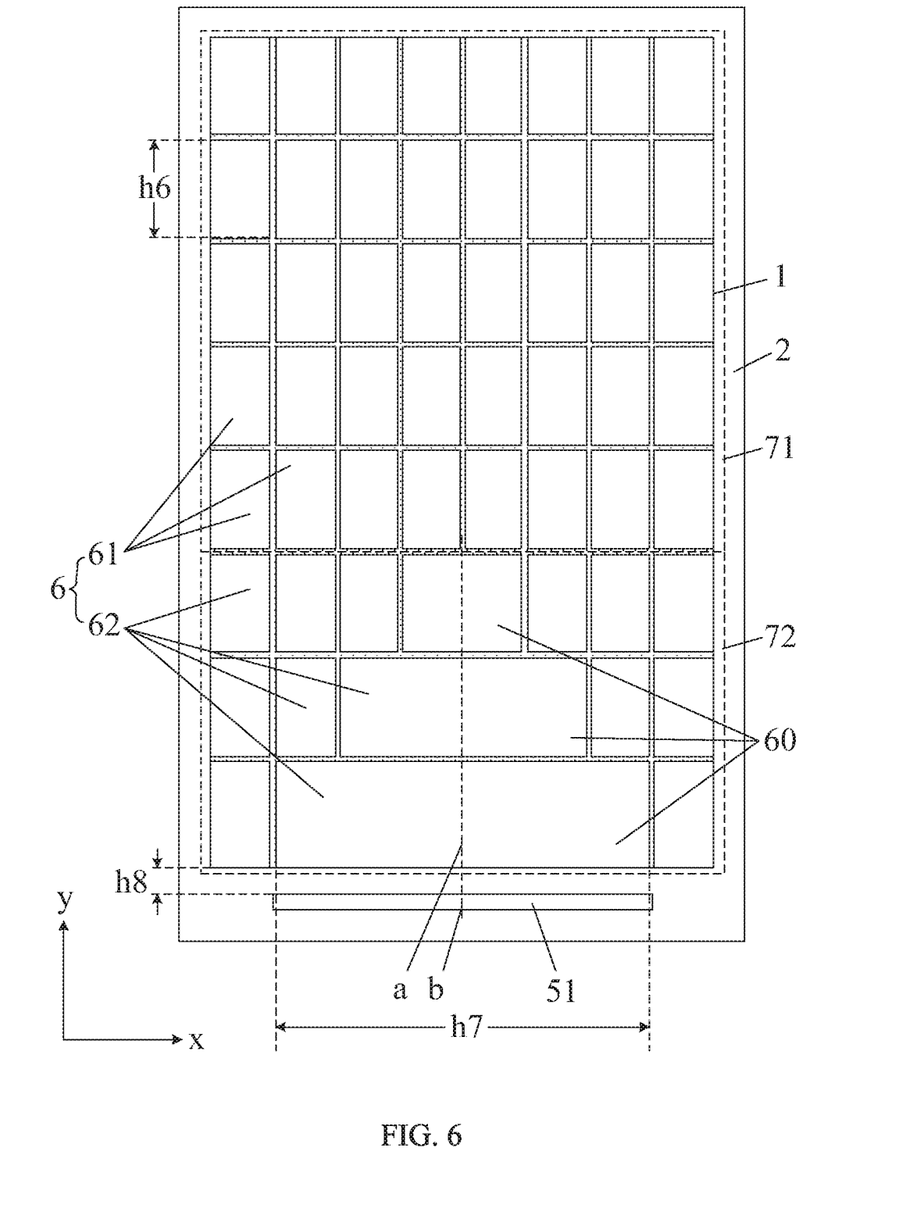
FIG. 6 illustrates a structural schematic diagram of still another display panel according to an embodiment of the present disclosure.

Optionally, as shown in FIG. 6, which illustrates a structural schematic diagram of still another display panel in accordance with an exemplary embodiment of the present disclosure, a length h6 of each grid 6 in the second direction y is equal to each other. The grid structure includes a first area 71 and a second area 72, the first area 71 is a portion of the display area 1 away from the first driving chip 51, and the second area 72 is a portion of the display area 1 close to the first driving chip 51, the grid density in the first area 71 is larger than the grid density in the second area 72. The plurality of grids 6 includes a plurality of first grids 61 in the first area 71 and a plurality of second grids 62 in the second area 72. The plurality of first grids 61 is distributed in a matrix; the plurality of second grids 62 is arranged in multiple rows along the second direction y. Each row of second grids 62 includes a specific grid 60, a center line a of the specific grid 60 extending along the second direction y coincides with a center line b of the first driving chip 51 extending along the second direction y. A length h7 of each specific grid 60 in the first direction x is in negative correlation with a distance h8 between the specific grid 60 and the first driving chip 51. By adjusting the lengths h7 of the specific grids 60 at different positions in the first direction x to achieve different grid densities at different positions, so that in a radial direction outward from the first driving chip 51 being a center, the grid density is in positive correlation with a distance between the grid 6 and the first driving chip 51, and thus in the power supplying process, in the grid structure, current transmitted in the grids in uniform at different positions.

It should be understood that, the first area 71 shown in FIG. 6 has a uniform grid density. In addition, it is also possible to further set the grid density in the first area 71 according to the location of the first driving chip 51, for example, the length of each row of the first grids 61 in the second direction y is in negative correlation with the distance between the row of the first grids 61 and the first driving chip 51. That is, the larger the distance between the first grid 61 and the first driving chip 51 is, the smaller the length of the first grid 61 in the second direction y is. As a result, in the first area 71, the closer a position to the first driving chip is, the larger the resistance at this position is, and the further a position is away from the first driving chip, the smaller the resistance at this position is.

It should be noted that, the above embodiments merely illustrate configurations of the grid densities at different positions in several different manners. Embodiments of the present disclosure do not limit the specific implementation of the grid structure as long as it can achieve that, in a direction away from the driving chip, the further the position of the grid structure is away from the driving chip, the larger the grid density of this position of the grid structure is, so that in the power supplying process, in the grid structure, current transmitted in the grids is uniform at different positions.

Figure 7:
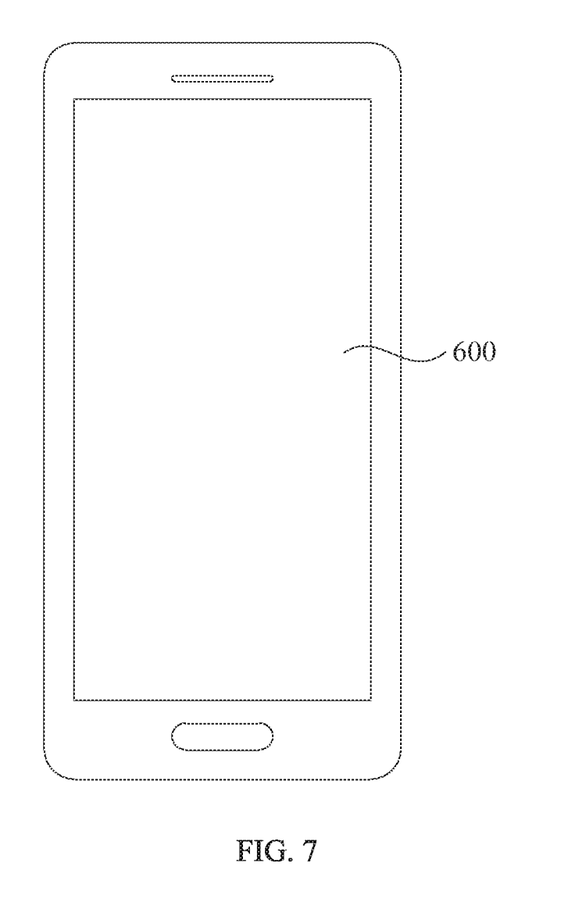
FIG. 7 illustrates a structural schematic diagram of a display device according to an embodiment of the present disclosure.

As shown FIG. 7, which illustrates a structural schematic diagram of a display device in accordance with an exemplary embodiment of the present disclosure, the present disclosure provides a display device including the above-described display panel 600.

A specific structure and principle of the display panel 600 can be referred to the above-described embodiments, which will not be further described herein. For example, the display device may be any electronic device having a display function, such as a touch display screen, a cellphone, a tablet computer, a laptop, an e-book or a television.

In an exemplary embodiment of the present disclosure, in the display device, the display panel is provided with the grid structure defined by the plurality of first power lines intersecting with the plurality of second power lines, the grid density at the position closer to the driving chip 5 is smaller, and the resistance is larger accordingly; the grid density of the position further away from the driving chip 5 is larger, and the resistance is smaller accordingly. Therefore, in power supplying process, in the grid structure, current transmitted in the grids is uniform at different positions, and thus power supply voltages received by the OLEDs are uniform at different positions, thereby solving the problem of a non-uniform brightness of the display screen.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:

1. A display panel, comprising:
   a display area, the display area comprising a plurality of organic light-emitting diodes (OLEDs), a plurality of first power lines and a plurality of second power lines; and
   a peripheral area outside the display area, the peripheral area comprising at least one driving chip;
   wherein the plurality of OLEDs is distributed in a matrix; the plurality of first power lines extends in a first direction, the plurality of second power lines extends in a second direction, the plurality of first power lines is intersected and connected with the plurality of second power lines to form a grid structure, and the grid structure is electrically connected with anodes of the plurality of OLEDs; the at least one driving chip is electrically connected with the grid structure; and
   wherein the grid structure comprises a plurality of grids defined by the plurality of first power lines being intersected with the plurality of second power lines, and has a larger grid density at one position than that at another position closer to the driving chip.

2. The display panel according to claim 1, wherein,
   the at least one driving chip comprises a first driving chip and a second driving chip, and the first driving chip and the second driving chip are respectively located at two opposite sides of the display area.

3. The display panel according to claim 1, wherein,
   the at least one driving chip comprises a first driving chip, a second driving chip, a third driving chip and a fourth driving chip;
   the first driving chip and the second driving chip are respectively located at two opposite sides of the display area in the first direction;
   the third driving chip and the fourth driving chip are respectively located at two opposite sides of the display area in the second direction.

4. The display panel according to claim 1, wherein,
   the at least one driving chip comprises a first driving chip, and the first driving chip is located at a side of the display area in the second direction.

5. The display panel according to claim 4, wherein,
   the first direction is perpendicular to the second direction.

6. The display panel according to claim 5, wherein,
   the plurality of grids is distributed in a matrix;
   the plurality of grids has an identical length in the first direction;
   the plurality of grids is arranged in a plurality of rows along the second direction; and
   a length of each row of grids in the second direction is in negative correlation with a distance between the row of grids and the first driving chip.

7. The display panel according to claim 5, wherein,
   the plurality of grids has an identical length in the first direction;
   the grid structure comprises a first area and a second area, the first area is a portion of the display area away from the first driving chip, and the second area is a portion of the display area close to the first driving chip, a grid density in the first area is larger than a grid density in the second area;
   the plurality of grids comprises a plurality of first grids in the first area and a plurality of second grids in the second area;
   the plurality of first grids is distributed in a matrix;
   the plurality of second grids is arranged in a plurality of columns along the first direction, each column of second grids comprises multiple second grids arranged along the second direction;
   in each column of second grids, any two adjacent second grids have a common edge; and
   in any adjacent two columns of second grids, any two common edges in different columns are located at two straight lines parallel to each other.

8. The display panel according to claim 7, wherein,
   a length of any second grid in the second direction is larger than a length of any first grid in the second direction.

9. The display panel according to claim 7, wherein,
   the plurality of first grids is arranged in a plurality of rows along the second direction; and
   a length of each row of first grids in the second direction is in negative correlation with a distance between the row of first grids and the first driving chip.

10. The display panel according to claim 5, wherein,
    the plurality of grids has an identical length in the second direction;
    the grid structure comprises a first area and a second area, the first area is a portion of the display area away from the first driving chip, and the second area is a portion of the display area close to the first driving chip, a grid density in the first area is larger than a grid density in the second area;
    the plurality of grids comprises a plurality of first grids in the first area and a plurality of second grids in the second area;
    the plurality of first grids is distributed in a matrix;
    the plurality of second grids is arranged in a plurality of rows along the second direction, each row of second grids comprises a specific grid;
    a center line of the specific grid extending along the second direction coincides with a center line of the first driving chip extending along the second direction;
    a length of each specific grid in the first direction is in negative correlation with a distance between the specific grid and the first driving chip.

11. A display device, comprising a display panel, wherein the display panel comprises:
    a display area, the display area comprising a plurality of organic light-emitting diodes (OLEDs), a plurality of first power lines and a plurality of second power lines; and
    a peripheral area outside the display area, the peripheral area comprising at least one driving chip;
    wherein the plurality of OLEDs is distributed in a matrix; the plurality of first power lines extends in a first direction, the plurality of second power lines extends in a second direction, the plurality of first power lines is intersected and connected with the plurality of second power lines to form a grid structure, and the grid structure is electrically connected with anodes of the plurality of OLEDs; the at least one driving chip is electrically connected with the grid structure; and
    wherein the grid structure comprises a plurality of grids defined by the plurality of first power lines being intersected with the plurality of second power lines, and has a larger grid density at one position than that at another position closer to the driving chip.

* * * * *